United States Patent [19]

Walker et al.

[11] Patent Number: 5,313,111
[45] Date of Patent: May 17, 1994

[54] SUBSTRATE SLEW CIRCUIT PROVIDING REDUCED ELECTRON INJECTION

[75] Inventors: Darryl Walker; Daniel F. McLaughlin, both of Dallas, Tex.

[73] Assignee: Texas Instruments Incorporated, Dallas, Tex.

[21] Appl. No.: 105,487

[22] Filed: Aug. 11, 1993

Related U.S. Application Data

[63] Continuation of Ser. No. 4,215, Jan. 13, 1993, abandoned, which is a continuation of Ser. No. 843,781, Feb. 28, 1992, abandoned.

[51] Int. Cl.⁵ .............................................. H03K 3/01
[52] U.S. Cl. .................... 307/296.2; 307/263; 307/264; 307/296.5; 307/296.8; 328/34
[58] Field of Search .............. 307/228, 264, 268, 263, 307/288, 584, 601, 296.2, 296.1, 296.3, 296.4, 296.5, 296.6, 296.8; 328/34, 55

[56] References Cited

U.S. PATENT DOCUMENTS

| | | | |
|---|---|---|---|
| 4,401,897 | 8/1983 | Martino, Jr. et al. | 307/296.2 |
| 4,403,158 | 9/1983 | Slemmer | 307/296.2 |
| 4,473,758 | 9/1984 | Huntington | 307/296.2 |
| 4,686,388 | 8/1987 | Hafner | 307/296.2 |
| 4,733,108 | 3/1988 | Truong | 307/296.2 |
| 4,742,250 | 5/1988 | Tobita | 307/296.2 |
| 4,754,168 | 6/1988 | Liran | 307/296.2 |
| 4,794,278 | 12/1988 | Vajdic | 307/296.2 |
| 4,825,142 | 4/1989 | Wang | 307/296.2 |
| 4,890,011 | 12/1989 | Miyatake | 307/296.2 |
| 5,045,716 | 9/1991 | Takacs et al. | 307/296.2 |
| 5,072,134 | 12/1991 | Min | 307/296.2 |
| 5,184,030 | 2/1993 | Chung et al. | 307/296.2 |
| 5,210,446 | 5/1993 | Niuya et al. | 307/296.2 |

OTHER PUBLICATIONS

IBM Tech. Discl. Bultn., Chang, "FET N-Channel Threshold Voltage-Control Circuit", Jun. 1974, p. 140.

*Primary Examiner*—William L. Sikes
*Assistant Examiner*—Terry D. Cunningham
*Attorney, Agent, or Firm*—Ronald O. Neerings; James C. Kesterson; Richard L. Donaldson

[57] ABSTRACT

The described embodiments of the present invention provide a substrate slew circuit that eliminates electron injection. The slew circuit comprises a semiconductor substrate, first and second transistors and a control circuit. One of a source/drain of the source/drain of the first transistor is connected to a reference voltage. One of a source/drain of the second transistor is connected to a gate of the first transistor, the other of the source/drain of the second transistor is coupled to receive a first voltage signal from a substrate pump. The control circuit is connected to the gate of the second transistor for controlling the passage of current from the other of the source/drain of the second transistor to the one of a source/drain of the second transistor.

13 Claims, 3 Drawing Sheets

SUBSTRATE SLEW CIRCUIT PROVIDING REDUCED ELECTRON INJECTION

This application is a continuation of application Ser. No. 08/004,215, filed Jan. 13, 1993 (now abandoned) which is a continuation of Ser. No. 07/843,781 filed Feb. 28, 1992 (now abandoned).

FIELD OF THE INVENTION

The present invention relates to the field of integrated circuitry and, more particularly, to a substrate slew circuit having reduced electron injection.

BACKGROUND OF THE INVENTION

DRAMS and many other integrated circuits require a negative NMOS substrate voltage. A negative NMOS substrate voltage lowers the junction capacitance of NMOS transistors, prevents forward biasing of p-n junctions and improves the isolation of DRAM storage cells by increasing the threshold voltage of the thick-field transistors.

A negative substrate bias is achieved by using a capacitor to pump the substrate negative through a MOS diode. A typical substrate pump can be seen in FIG. 1. Φ1 and Φ2 are 180° out of phase clock signals that oscillate between Vdd and Vss. When 01 is at Vdd, Φ2 is at Vss and node N1 is precharged to Vss through PMOS transistor T1. When Φ1 goes from Vdd to Vss node N1 is booted to a negative potential and its charge is transferred to the substrate through PMOS diode D1. Node N1 going negative precharges node N2 to Vss through PMOS transistor T2. Thus we have a two phase substrate biasing pump. The substrate voltage is limited to $-Vdd+|Vtd|$, where $|Vtp|$ is the threshold voltage of the PMOS diode. It can be seen that the substrate voltage is dependent upon the voltage supply Vdd.

A problem may develop when Vdd slews from a higher voltage to a lower voltage and the substrate has no discharge path to enable it to become less negatively biased. When this happens, the threshold voltages of the integrated circuits NMOS transistors are too large for optimal operation of the circuitry, due to the body effect on the threshold voltages. A circuit, when in FIGS. 2, connected to the substrate pump of FIG. 1 overcomes this problem by causing the substrate voltage to become more shallow (less negative) during slew conditions.

In the circuit of FIG. 2, input N1 is connected to node N1 of the substrate pump of FIG. 1. Input N2 is connected to node N2 of the substrate pump of FIG. 1. The circuit of FIG. 2 operates by comparing the negative voltage of input N1 to node N3. When the voltage on input N1 is a high voltage, the voltage on input N2 is a low voltage so NMOS transistor T3 is off and the voltage on node N3 remains the same. When the voltage on input N1 is low, the voltage on input N2 is high so input N1's low voltage is then passed to node N3. Therefore, if input N1's low voltage becomes an NMOS threshold voltage (Vtn) above Vbb (substrate voltage), NMOS transistor T4 turns on and Vbb becomes more shallow until node N1's low voltage is $\leq Vbb+Vtn$. Since $Vbb \geq -Vdd+|Vtp|$, Vdd must slew down by at least $|Vtp|+Vtn$ for this circuit to be effective.

A major problem with circuits that have nodes at negative voltages is the risk of forward biasing the pn junctions in the NMOS transistors. If the drain or source of an NMOS transistor, shown in FIG. 3, gets a Vtpn (the turn on voltage of a pn junction diode) below Vbb, the diode becomes conductive and electrons are injected from the more heavily doped n-type source/drain area into the more lightly doped p-type substrate. Electrons injected into the more lightly doped p-type substrate travel freely until they either recombine in the substrate or are collected by a more positively charged region such as a DRAM storage cell. These injected electrons can cause DRAM storage cells to lose a true "1" stored in them if the number of injected electrons collected by a storage cell is large enough.

Input N1 in FIG. 2 is one such problematic injection node. The node voltage oscillates between ground and $Vbb-|Vtd|$ causing the p-n diode from the source to the substrate of transistor T3 to become forward biased since Vbb is typically no deeper than $(-Vdd)+|Vtp|$. This result is undesirable. What is needed is a circuit that performs this same slew function without the risk of electron injection.

SUMMARY OF THE INVENTION

The described embodiments of the present invention provide a circuit for employing a substrate slew circuit in an integrated circuit having a substrate pump. The slew circuit boots a PMOS transistor to produce a gate voltage low enough to pass a first voltage signal from a substrate pump to the gate of a transistor having one of its source/drain coupled to the substrate and the other of its source/drain coupled to Vss.

The substrate slew circuit significantly reduces electron injection into the substrate, as compared to prior substrate slew circuits, while providing excellent slew circuit sensitivity.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

The following detailed description relates to a technique for obtaining a substrate slew circuit that overcomes the electron injection problems of prior substrate slew circuits.

Figure 1:
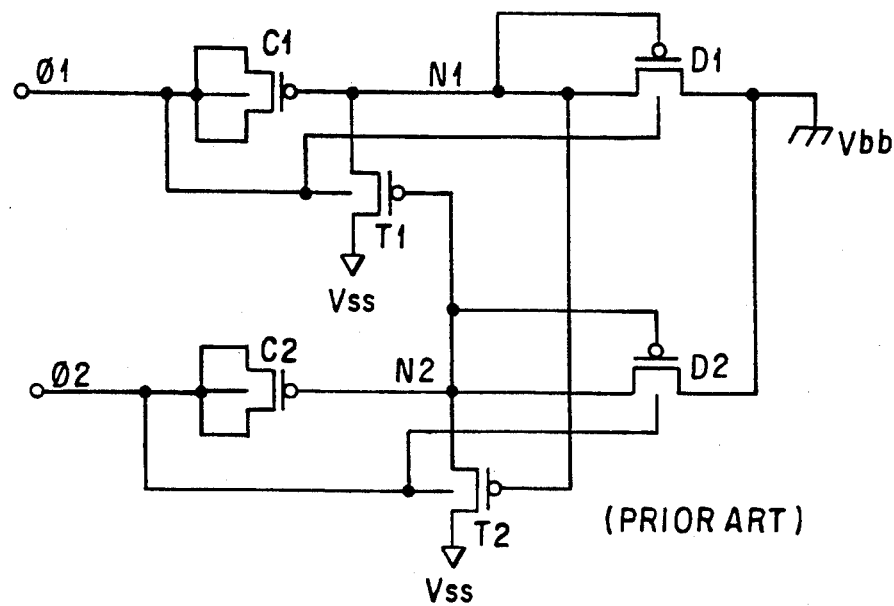
FIG. 1 illustrates in schematic form a prior art substrate pump for use in an integrated circuit.
Figure 4:
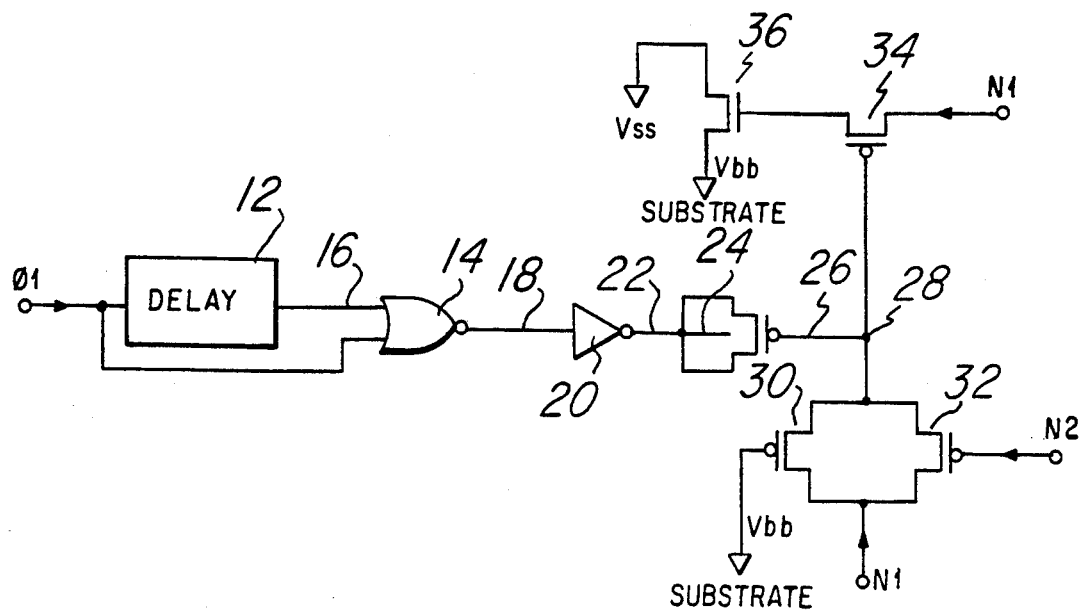
FIG. 4 illustrates in schematic form a substrate slew circuit for use in combination with the substrate pump of FIG. 1, according to one embodiment of the present invention.

The substrate slew circuit shown in FIG. 4 is used in conjunction with the substrate pump of FIG. 1. Referring to FIG. 4, an input of DELAY circuit 12 and a first input of NOR gate 14 are coupled to receive clock signal 01, which is the same clock signal 01 received by the circuit of FIG. 1. Signal line 16 couples an output of DELAY circuit 12 to a second input of NOIF-gate 14. Signal line 18 couples the output of NOR gate 14 to the input of inverter 20. Signal line 22 couples the output of inverter 20 to the source and drain of PMOS transistor 24. Signal line 26 couples the gate of PMOS transistor 24 to node 28. (A traditional capacitor may be used in lieu of the PMOS transistor 24 with the first plate being connected to signal line 22 and the second plate being connected to signal line 26).

One of a source/drain of PMOS transistor 30 and one of a source/drain of PMOS transistor 32 are connected to input N1 which is coupled to node N1 of the circuit of FIG. 1. The gate of transistor 30 is connected to coupled to the substrate. The gate of tr is coupled to node N2 of the circuit of FIG. 1. The other of the source/drain of transistor 30 and the other of the source/drain of transistor 32 are coupled to node 28. Node 28 is coupled to the gate of PMOS transistor 34. One of a source/drain of transistor 34 connected to input N1 which is coupled to node N1 of the circuit if FIG. 1. The other of the source/drain of transistor 34 is coupled to the gate of an NMOS transistor 36. One of a source/drain of transistor 36 is coupled to Vss. The other of the source/drain of transistor 36 is coupled to the substrate.

The circuit of FIG. 4 operates by booting PMOS transistor 34 to produce a gate voltage low enough to pass the signal on input N1 to the gate of transistor 36. By using a PMOS pass gate to pass a voltage lower than Vbb to the gate of transistor 36, electron injection is totally eliminated.

Figure 5:
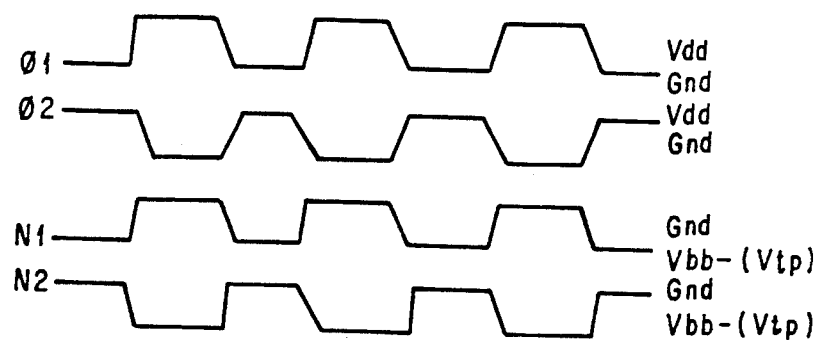
FIG. 5 illustrates in graphic form the relationship between clock signals Φ1, Φ2 and nodes N1 and N2.

Delay stage 12 is used to delay the negative edge of clock signal $\Phi 1$, which is in phase with the signal on input N1, to allow node 28 sufficient time to precharge to $Vbb + |Vtp|$ before it is booted. The bypass of delay, stage 12 allows a quick reset of node 28 to insure that a high voltage spike on input N1 does not pass through to the gate of transistor 36. Node 28 is precharged to input N1's high voltage (approximately Vss) when the signal on input N1 is high through PMOS transistor 32 thus turning PMOS transistor 34 off. FIG. 5 shows the relationship between the voltage levels of clock signals $\Phi 1$, $\Phi 2$, node N1 and node N2.

Figure 2:
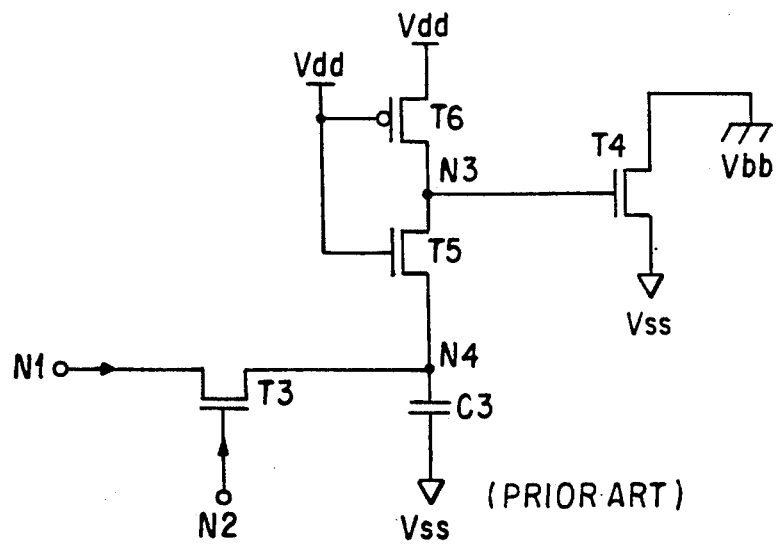
FIG. 2 illustrates in schematic form a prior art substrate slew circuit used in combination with the substrate pump of FIG. 1.
Figure 3:
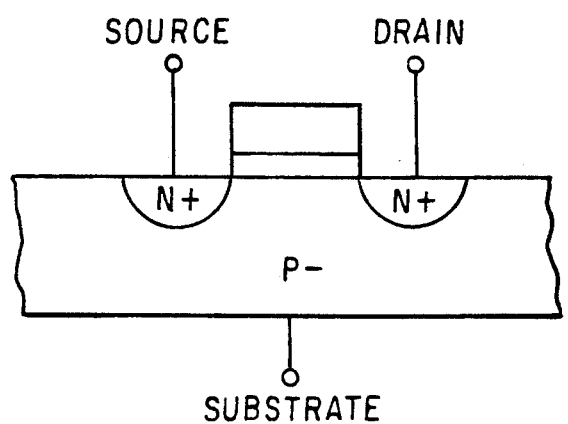
FIG. 3 illustrates a cross sectional view of an NMOS transistor.

The circuit of FIG. 4 eliminates the problem of electron injection inherent in the circuit of FIG. 2. The sensitivity of the circuit of FIG. 4 is at least as good as that offered by the circuit of FIG. 2. The improvement offered by the circuit of FIG. 4 over the circuit of FIG. 2 makes the claimed invention desirable for applications such as DRAMs which used trench type storage cells or any other integrated circuit which uses a negatively biased substrate and has undesirable effects due to electrons injected into the substrate.

While this invention has been described with reference to an illustrative embodiment, this description is not to be construed in a limiting sense. For example, the slew circuit may be used in conjunction with substrate pumps other than the one disclosed in FIG. 1. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

We claim:

1. A device, comprising:
 a semiconductor substrate;
 one of a source/drain of a first transistor connected to said substrate, the other of a source/drain of said first transistor directly connected to a DC voltage;
 one of a source/drain of a second transistor directly connected to a gate of said first transistor, the other of a source/drain of said second transistor coupled to receive an AC signal; and
 a circuit connected to the gate of said second transistor for controlling the passage of current from said other of said source/drain of said second transistor to said one of a source/drain of said second transistor.

2. The device of claim 1 in which said AC signal is a clock signal.

3. The device of claim 1 in which said first transistor is an NMOS transistor.

4. The device of claim 1 in which said second transistor is a PMOS transistor.

5. A device comprising:
 a) a semiconductor substrate;
 b) one of a source/drain of a first transistor connected to said substrate, the other of a source/drain of said first transistor connected to a substantially constant reference voltage;
 c) one of a source/drain of a second transistor connected to a gate of said first transistor, the other of a source/drain of said second transistor coupled to receive a first voltage signal; and
 d) a circuit connected to the gate of said second transistor for controlling the passage of current from said other of said source/drain of said second transistor to said one of a source/drain of said second transistor, said circuit comprising:
  (i) a delay circuit having an input coupled to receive a first clock signal and a logic gate having a first input coupled to receive said first clock signal, a second input of said logic gate coupled to an output of said delay circuit and an output coupled to an input of an inverter, an output of said inverter coupled to a first plate of a capacitive element and a second plate of said capacitive element coupled to said gate of said second transistor; and
  (ii) one of a source/drain of a third transistor rand one of a source/drain of a fourth transistor coupled to receive said first voltage signal, a gate of said third transistor connected to said substrate and a gate of said fourth transistor coupled to receive a second voltage signal, the other of said source/drain of said third transistor and the other source/drain of said fourth transistor coupled to said gate of said second transistor.

6. The device of claim 5 in which said logic gate is a NOR gate.

7. The device of claim 5 in which said third transistor is a PMOS transistor.

8. The device of claim 5 in which said fourth transistor is a PMOS transistor.

9. The device of claim 5 in which said capacitive element is a PMOS transistor with the source and drain coupled as said first plate and said gate being said second plate.

10. The device of claim 5 in which said first voltage signal and said second voltage signal are generated by a source outside of the substrate pump.

11. A device, comprising:
 a semiconductor substrate;

one of source/drain of a first transistor connected to said substrate, the other of a source/drain of said first transistor directly connected to a DC voltage; and a first terminal of a second transistor directly connected to a gate of said first transistor, a second terminal of said second transistor coupled to receive a controlled AC signal, an a third terminal of said second transistor connected to a voltage generating circuit.

12. The device of claim 11 in which said first terminal of sad second transistor is one of a source/drain of said second transistor.

13. The device of claim 11 in which said AC signal is a clock signal.

* * * * *